United States Patent
Lee et al.

(10) Patent No.: US 11,283,042 B2
(45) Date of Patent: Mar. 22, 2022

(54) DISPLAY APPARATUS WITH HEAT SINK LAYERS

(71) Applicant: LG DISPLAY CO., LTD., Seoul (KR)

(72) Inventors: Hyokang Lee, Incheon (KR); MinGu Cho, Incheon (KR); SangHoon Lee, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 9 days.

(21) Appl. No.: 16/135,901

(22) Filed: Sep. 19, 2018

(65) Prior Publication Data

US 2019/0198802 A1 Jun. 27, 2019

(30) Foreign Application Priority Data

Dec. 26, 2017 (KR) ........................ 10-2017-0179419

(51) Int. Cl.
*H01L 51/52* (2006.01)
*H01L 27/32* (2006.01)
*H01L 27/12* (2006.01)
*H01L 51/56* (2006.01)
*H01L 51/50* (2006.01)

(52) U.S. Cl.
CPC ........ *H01L 51/5246* (2013.01); *H01L 27/124* (2013.01); *H01L 27/322* (2013.01); *H01L 27/3246* (2013.01); *H01L 27/3258* (2013.01); *H01L 27/3262* (2013.01); *H01L 51/5012* (2013.01); *H01L 51/525* (2013.01); *H01L 51/529* (2013.01); *H01L 51/5284* (2013.01); *H01L 51/56* (2013.01)

(58) Field of Classification Search
CPC .............. H01L 51/5246; H01L 27/124; H01L 27/322; H01L 27/3246; H01L 27/3258; H01L 27/3262; H01L 51/5012; H01L 51/525; H01L 51/5284; H01L 51/529; H01L 51/56
USPC .............................................. 257/40, 89, 98
See application file for complete search history.

(56) References Cited

U.S. PATENT DOCUMENTS

| 2007/0102737 A1* | 5/2007 | Kashiwabara ...... H01L 27/3211 257/291 |
| 2010/0019654 A1* | 1/2010 | Hayashi .............. H01L 51/5256 313/498 |
| 2012/0286312 A1* | 11/2012 | Hatano ............... H01L 27/3246 257/98 |
| 2015/0115229 A1* | 4/2015 | Jung ..................... H01L 51/524 257/40 |
| 2016/0218317 A1* | 7/2016 | Hong .................. H01L 27/3258 |

* cited by examiner

*Primary Examiner* — Robert T Huber
(74) *Attorney, Agent, or Firm* — Birch, Stewart, Kolasch & Birch, LLP

(57) ABSTRACT

Disclosed is a display apparatus including a transistor substrate including an emission part overlapping a plurality of organic light emitting devices and a peripheral part surrounding the emission part, a plurality of color filters disposed to respectively correspond to the plurality of organic light emitting devices at the emission part, and a plurality of spacer members spaced apart from one another and disposed to surround the plurality of organic light emitting devices at the peripheral part. Accordingly, the display apparatus is protected from an external impact, and heat transferred to the inside of the display apparatus is easily dissipated to the outside.

18 Claims, 8 Drawing Sheets

DISPLAY APPARATUS WITH HEAT SINK LAYERS

CROSS-REFERENCE TO RELATED APPLICATIONS

This application claims the priority benefit of the Korean Patent Application No. 10-2017-0179419 filed on Dec. 26, 2017 in the Republic of Korea, which is hereby incorporated by reference into the present application as if fully set forth herein.

BACKGROUND

Field of the Invention

The present disclosure relates to a display apparatus.

Discussion of the Related Art

Display apparatuses are being widely used as a display screen of notebook computers, tablet computers, smartphones, portable display apparatuses, and portable information devices in addition to a display screen of television (TVs) or monitors.

Liquid crystal display (LCD) apparatuses and organic light emitting display apparatuses display an image by using thin film transistors (TFTs) as switching elements. Since the LCD apparatuses does not self-emit light, the LCD apparatuses display an image by using light emitted from a backlight unit which is disposed under a liquid crystal display panel. Since the LCD apparatuses include the backlight unit, there is a limitation in design, and luminance and a response time are reduced. Since the organic light emitting display apparatuses include an organic material, the organic light emitting display apparatuses are vulnerable to water, causing a reduction in reliability and lifetime.

Recently, research and development on light emitting diode display apparatuses including a micro light emitting device are being conducted. The light emitting diode display apparatuses have high image quality and high reliability and thus, are attracting much attention as the next-generation display apparatuses.

In a related art display apparatus, a transistor substrate and a color filter substrate respectively stacked on carrier glass substrates are bonded to each other and then, a carrier glass substrate supporting the transistor substrate and a carrier glass substrate supporting the color filter substrate are removed through a laser release process. In this case, a laser irradiated through the laser release process can transfer heat to an organic light emitting device layer. For this reason, the laser irradiated onto the carrier glass substrates damages the organic light emitting device layer, and due to this, the organic light emitting device layer is creased or contracted. Also, since the organic light emitting device layer is vulnerable to the heat of the laser, the organic light emitting device layer is peeled, and due to the peeling, organic light emitting devices are damaged.

Moreover, when the related art display apparatus is implemented as a flexible display apparatus or a stretchable display apparatus, the related art display apparatus is vulnerable to an external impact, causing the damage of a thin film transistor.

SUMMARY

Accordingly, the present disclosure is directed to provide a display apparatus that substantially obviates one or more problems due to limitations and disadvantages of the related art.

An aspect of the present disclosure is directed to provide a display apparatus in which a spacer member surrounding a thin film transistor and an organic light emitting device is provided, and thus, an external impact applied to the display apparatus is reduced so as not to be transferred to the thin film transistor and the organic light emitting device, thereby complementing the durability of the display apparatus to enhance reliability.

Another aspect of the present disclosure is directed to provide a display apparatus which includes first and second heat sink layers disposed between a transistor substrate and a color filter substrate and a spacer member disposed between the first and second heat sink layers, thereby easily dissipating heat, passing through a substrate, to the outside in a laser release process.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a display apparatus including a transistor substrate including an emission part overlapping a plurality of organic light emitting devices and a peripheral part surrounding the emission part, a plurality of color filters disposed to respectively correspond to the plurality of organic light emitting devices at the emission part, and a plurality of spacer members spaced apart from one another and disposed to surround the plurality of organic light emitting devices at the peripheral part.

Details of other embodiments are included in the detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
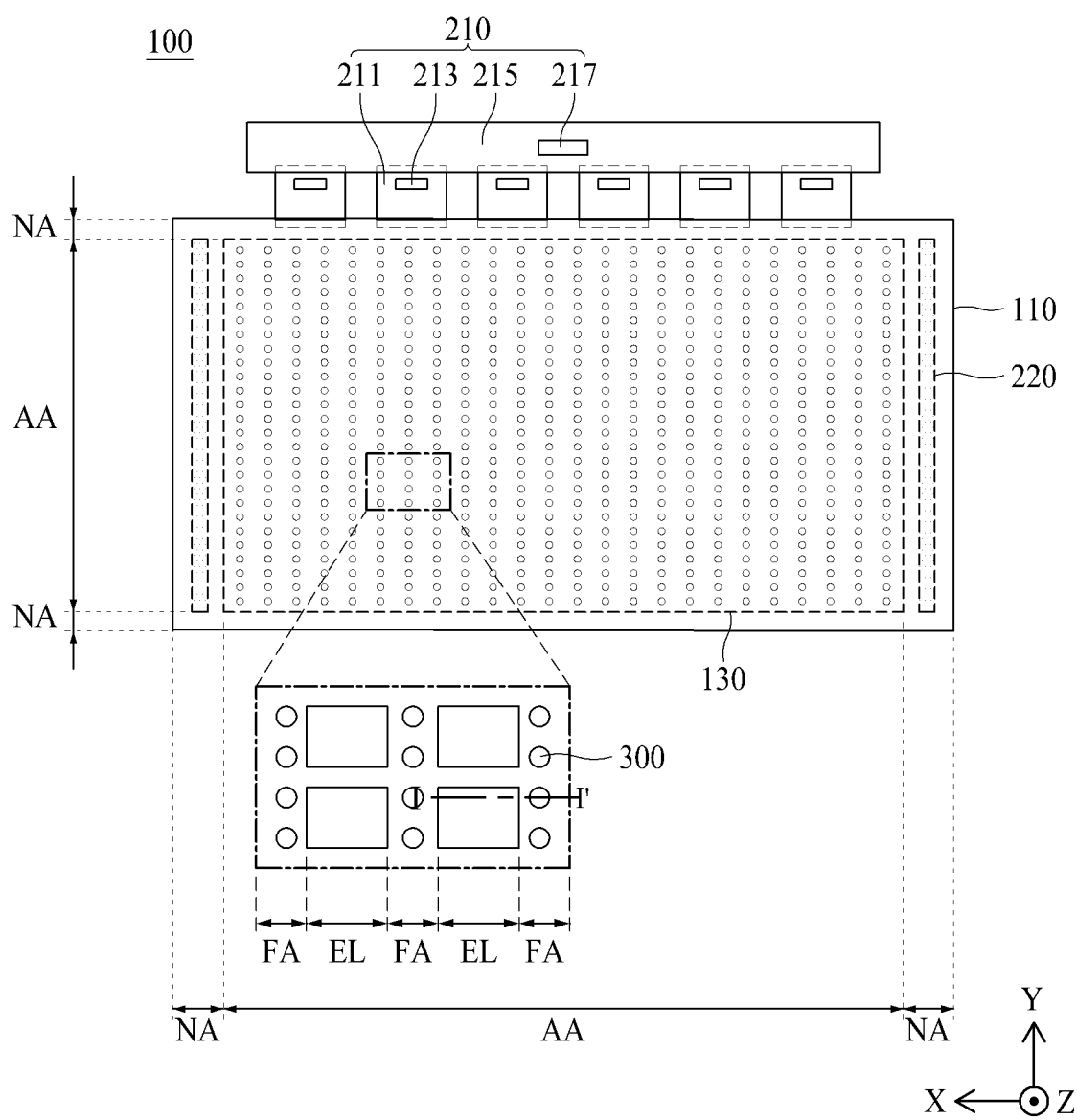
FIG. 1 is a plan view illustrating a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only~' is used. The terms of a singular form can include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts can be disposed between the two parts unless 'just' or 'direct' is used.

In describing a time relationship, for example, when the temporal order is described as 'after~', 'subsequent~', 'next~', and 'before~', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. can be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

Therefore, in the present disclosure, examples of the display apparatus can include a narrow-sense display apparatus itself, such as a liquid crystal module (LCM) or an organic light emitting display (OLED) module, and a set device which is a final consumer device or an application product including the LCM or the OLED module.

For example, when a display panel is an organic light emitting display panel, the display panel can include a plurality of gate lines, a plurality of data lines, and a plurality of pixels respectively provided in a plurality of pixel areas defined by intersections of the gate lines and the data lines. Also, the display panel can include an array substrate including a TFT which is an element for selectively applying a voltage to each of the pixels, an organic light emitting device layer on the array substrate, and an encapsulation substrate disposed on the array substrate to cover the organic light emitting device layer. The encapsulation substrate can protect the TFT and the organic light emitting device layer from an external impact and can prevent water or oxygen from penetrating into the organic light emitting device layer. Also, a layer provided on the array substrate can include an inorganic light emitting layer (for example, a nano-sized material layer, a quantum dot, or the like).

Moreover, the display panel can further include a backing such as a metal plate attached on the display panel. However, the present embodiment is not limited to the metal plate, and the display panel can include another structure.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings.

FIG. 1 is a plan view illustrating a display apparatus 100 according to an embodiment of the present disclosure. All the components of the display apparatus according to all embodiments of the present disclosure are operatively coupled and configured.

Referring to FIG. 1, the display apparatus 100 can include a transistor substrate 110, a pixel array layer 130, a display driving circuit unit 210, a scan driving circuit unit 220, and a plurality of spacer members 300.

According to an embodiment, the display apparatus 100 can display an image in a type such as a top emission type, a bottom emission type, or a dual emission type, based on a structure of the pixel array layer 130 including an anode electrode, a cathode electrode, and an organic compound layer. In the top emission type, the display apparatus 100 can display an image by irradiating visible light, emitted from the pixel array layer 130, onto a color filter substrate. In the bottom emission type, the display apparatus 100 can display an image by irradiating the visible light, emitted from the pixel array layer 130, onto the transistor substrate 110.

The transistor substrate 110, which can be a base substrate, can be a flexible substrate. For example, the transistor substrate 110 can include transparent polyimide. Considering a high temperature deposition process, the transistor substrate 110 including polyimide can use polyimide which endures a high temperature and is good in heat resistance. The transistor substrate 110 including polyimide can be formed by hardening polyimide resin which is coated to have a certain thickness on a front surface of a sacrificial layer provided on a carrier glass substrate. Here, the carrier glass substrate can be separated from the transistor substrate 110 by releasing the sacrificial layer through a laser release process. Also, the sacrificial layer can be formed of amorphous silicon (a-Si), silicon nitride (SiNx), and/or the like.

According to an embodiment, the transistor substrate 110 can be a glass substrate. For example, the transistor substrate 110 can include silicon dioxide (SiO$_2$) or oxide aluminum (Al$_2$O$_3$) as a main component.

The transistor substrate 110 can include a display area AA and a non-display area NA. The display area AA can be an area which displays an image, and can be defined in a center portion of the transistor substrate 110. Here, the display area AA can correspond to an active area of the pixel array layer 130. For example, the display area AA can include a plurality of pixels respectively provided in a plurality of pixel areas defined by intersections of a plurality of gate lines and a plurality of data lines. Here, each of the plurality of pixels can be defined as a minimum unit area which emits light.

The non-display area NA can be an area on which an image is not displayed, and can be defined in an edge of the transistor substrate 110 surrounding the display area AA.

The display area AA of the transistor substrate 110 can include an emission part EL and a peripheral part FA. In detail, the emission part EL can include a plurality of organic light emitting devices which emit lights. The peripheral part FA can surround the emission part EL. For example, the emission part EL can correspond to a unit pixel area including a plurality of subpixels, and the peripheral part FA can surround each of a plurality of unit pixels. Here, each of the plurality of subpixels can be defined as a minimum unit area which emits light. Each of the plurality of unit pixels can include at least three subpixels adjacent to one another. For example, the plurality of subpixels can include a red subpixel, a green subpixel, and a blue subpixel. Furthermore, the plurality of subpixels can further include a white subpixel.

According to an embodiment, the plurality of spacer members 300 disposed in the peripheral part FA and the plurality of organic light emitting devices disposed in the emission part EL can be alternately arranged in a first horizontal direction X. For example, the plurality of organic light emitting devices can be spaced apart from one another by the plurality of spacer members 300 in the first horizontal direction X. Also, the plurality of organic light emitting devices and the plurality of spacer members 300 can be arranged in parallel in a second horizontal direction Y.

According to another embodiment, the plurality of spacer members 300 disposed in the peripheral part FA can surround the plurality of organic light emitting devices disposed in the emission part EL.

The pixel array layer 130 can include a thin film transistor (TFT) layer and a light emitting device layer. The TFT layer can include a TFT, a gate insulation layer, an interlayer insulation layer, a passivation layer, and a planarization layer. The light emitting device layer can include an organic light emitting device and a bank.

The display driving circuit unit 210 can be connected to a pad part provided in the non-display area NA of the transistor substrate 110 and can allow each of the plurality of pixels to display an image corresponding to video data supplied from a display driving system. According to an embodiment, the display driving circuit unit 210 can include a plurality of circuit films 211, a plurality of data driving integrated circuits (ICs) 213, a printed circuit board (PCB) 215, and a timing controller 217.

Input terminals provided on one side of each of the plurality of circuit films 211 can be attached on the PCB 215 through a film attaching process, and output terminals provided on the other side of each of the plurality of circuit films 211 can be attached on the pad part through the film attaching process. According to an embodiment, each of the plurality of circuit films 211 can be implemented with a flexible circuit film, for decreasing a bezel area of the display apparatus 100 and can be bent to surround a side surface of a window cover.

Each of the plurality of data driving ICs 213 can be individually mounted on a corresponding circuit film of the plurality of circuit films 211. Each of the plurality of data driving ICs 213 can receive pixel data and a data control signal supplied from the timing controller 217, convert the pixel data into a pixel-based analog data signal according to the data control signal, and supply the analog data signal to a corresponding data line. According to an embodiment, each of the plurality of data driving ICs 213 can be disposed on the side surface of the window cover, based on bending of a corresponding circuit film of the plurality of circuit films 211.

The PCB 215 can support the timing controller 217 and can transfer power and signals between the elements of the display driving circuit unit 210. According to an embodiment, the PCB 215 can be disposed on a front surface of the window cover, based on bending of the plurality of circuit films 211.

The timing controller 217 can be mounted on the PCB 215 and can receive, through a user connector provided on the PCB 215, the video data and a timing synchronization signal supplied from the display driving system. The timing controller 217 can realign the video data to generate pixel data matching a pixel arrangement structure, based on the timing synchronization signal and can supply the generated pixel data to the data driving ICs 213. Also, the timing controller 217 can generate the data control signal and a scan control signal, based on the timing synchronization signal. Also, the timing controller 217 can control a driving timing of each of the plurality of data driving ICs 213 by using the data control signal and can control a driving timing of the scan driving circuit unit 220 by using the scan control signal. Here, the scan control signal can be supplied to a first and/or last flexible circuit film(s) of the plurality of circuit films 211 and the scan driving circuit unit 220 through the non-display area NA of the transistor substrate 110.

The scan driving circuit unit 220 can be provided in the non-display area NA of the transistor substrate 110. The scan driving circuit unit 220 can generate a scan signal according to the scan control signal supplied from the display driving circuit unit 210 and can supply the scan signal to a scan line corresponding to a predetermined order. According to an embodiment, the scan driving circuit unit 220 can be formed in the non-display area NA of the transistor substrate 110 along with TFTs.

The plurality of spacer members 300 can be spaced apart from one another to surround the plurality of organic light emitting devices in the peripheral part FA of the transistor substrate 110. The plurality of spacer members 300 will be described below in detail with reference to FIGS. 2 and 4.

Figure 2:
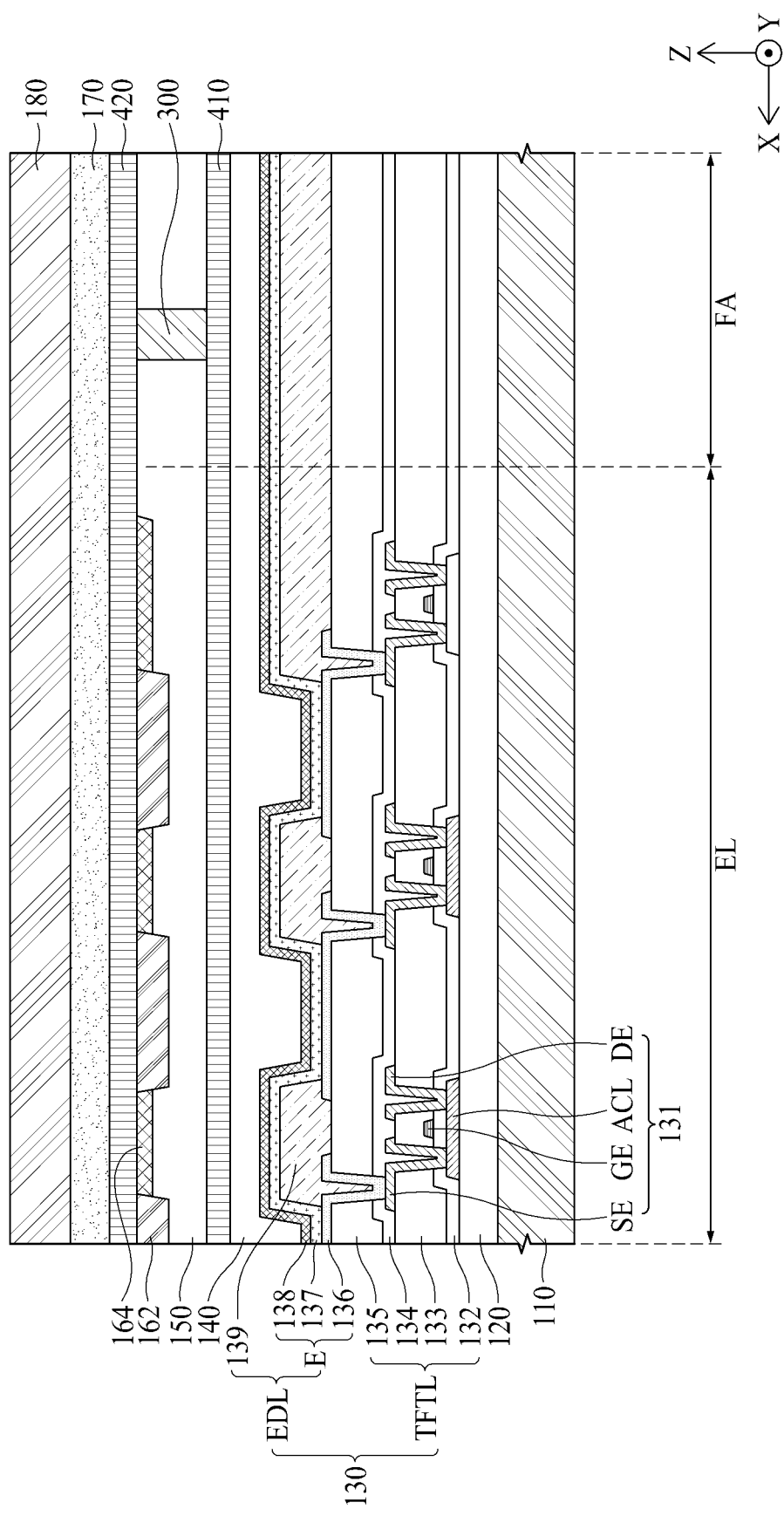
FIG. 2 is a cross-sectional view taken along line I-I' of FIG. 1, in a display apparatus according to a first embodiment of the present disclosure.

FIG. 2 is a cross-sectional view taken along line I-I' of FIG. 1, in a display apparatus 100 according to a first embodiment of the present disclosure.

Referring to FIG. 2, the display apparatus 100 can be implemented as a top emission type and can include a transistor substrate 110, a first buffer layer 120, a pixel array layer 130, an encapsulation layer 140, a filling layer 150, a plurality of color filters 162, a black matrix 164, a second buffer layer 170, a color filter substrate 180, a plurality of spacer members 300, a first heat sink layer 410, and a second heat sink layer 420.

The transistor substrate 110, which can be a base substrate, can be a flexible substrate. For example, the transistor substrate 110 can include transparent polyimide.

The first buffer layer 120 can be provided on the transistor substrate 110. The first buffer layer 120 can be provided on a whole front surface of the transistor substrate 110, for preventing water from penetrating into the pixel array layer 130 via the transistor substrate 110. The first buffer layer 120 can be formed by stacking a plurality of inorganic layers. For example, the first buffer layer 120 can be formed of a multilayer where one or more inorganic layers of silicon oxide (SiOx), silicon nitride (SiNx), and silicon oxynitride (SiON) are stacked. The first buffer layer 120 can include a plurality of inorganic layers, thereby enhancing a water vapor transmission rate (WVTR) of a panel.

The pixel array layer 130 can include a TFT layer TFTL and a light emitting device layer EDL. The TFT layer TFTL can include a TFT 131, a gate insulation layer 132, an interlayer insulation layer 133, a passivation layer 134, and a planarization layer 135.

The TFT 131 can be provided in the display area AA on the transistor substrate 110. The TFT 131 can include an active layer ACL, a gate electrode GE, a drain electrode DE, and a source electrode SE.

The active layer ACL can be provided in the display area AA on the transistor substrate 110. The active layer ACL can be disposed to overlap the gate electrode GE, the drain electrode DE, and the source electrode SE. The active layer ACL can directly contact the drain electrode DE and the source electrode SE and can face the gate electrode GE with the gate insulation layer 132 therebetween. According to an embodiment, a portion of the active layer ACL can be formed of a dopant-undoped semiconductor material, and another portion of the active layer ACL can be formed of a dopant-doped semiconductor material.

The gate electrode GE can be provided on the gate insulation layer 132. The gate electrode GE can overlap a center region of the active layer ACL. For example, the gate electrode GE can be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

The drain electrode DE and the source electrode SE can be provided on the interlayer insulation layer 133 and can be spaced apart from each other. The drain electrode DE can contact one end of the active layer ACL through a first contact hole provided in the gate insulation layer 132 and the interlayer insulation layer 133, and the source electrode SE can be the other end of the active layer ACL through a second contact hole provided in the gate insulation layer 132 and the interlayer insulation layer 133. The source electrode SE can directly contact a first electrode 136 of the organic light emitting device E through a third contact hole of the planarization layer 135.

The gate insulation layer 132 can be provided on the active layer ACL. In detail, the gate insulation layer 132 can be disposed on the active layer ACL and the transistor substrate 110 and can insulate the active layer ACL from the gate electrode GE. Also, the gate insulation layer 132 can be provided on a front surface of the display area AA of the transistor substrate 110, and a corresponding region of the gate insulation layer 132 can be removed in order for the active layer ACL to contact the drain electrode DE or the source electrode SE. For example, the gate insulation layer 132 can include the first contact hole through which the drain electrode DE passes and the second contact hole through which the source electrode SE passes. The gate insulation layer 132 can be formed of an inorganic insulation material, and for example, can be formed of $SiO_2$, SiNx, SiON, or a multilayer thereof, but is not limited thereto.

The interlayer insulation layer 133 can be provided on the gate electrode GE. For example, the interlayer insulation layer 133 can be formed of an inorganic insulation material, and for example, can be formed of $SiO_2$, SiNx, SiON, or a multilayer thereof, but is not limited thereto. A corresponding region of the interlayer insulation layer 133 can be removed in order for the active layer ACL to contact the drain electrode DE or the source electrode SE. For example, the interlayer insulation layer 133 can include the first contact hole through which the drain electrode DE passes and the second contact hole through which the source electrode SE passes. Here, each of the first contact hole and the second contact hole can be connected to the first contact hole or the second contact hole of the gate insulation layer 132.

The passivation layer 134 can be provided on the TFT 131. In detail, the passivation layer 134 can be provided to cover the source electrode SE, the drain electrode DE, and a data line and can protect the TFT 131. For example, the passivation layer 134 can be formed of an inorganic insulation material, and for example, can be formed of $SiO_2$, SiNx, SiON, or a multilayer thereof, but is not limited thereto.

The planarization layer 135 can be provided on the passivation layer 134 and can planarize an upper end of the TFT 131. A corresponding region of the planarization layer 135 can be removed in order for the first electrode 136 to contact the source electrode SE. For example, the planarization layer 135 can include the third contact hole through which the first electrode 136 passes. According to an embodiment, the planarization layer 135 can be formed of an organic insulating material such as acryl resin, epoxy resin, phenolic resin, polyamide resin, or polyimide resin, but is not limited thereto.

The light emitting device layer EDL can include a plurality of organic light emitting devices E and a bank 139.

The plurality of organic light emitting devices E can be provided on the planarization layer 135 and can be electrically connected to a plurality of TFTs 131. The plurality of organic light emitting devices E can each include the first electrode 136, an organic light emitting layer 137, and a second electrode 138.

The first electrode 136 can be provided on the planarization layer 135. In detail, the first electrode 136 can be disposed to overlap an opening area of the organic light emitting device E defined by the bank 139. Also, the first electrode 136 can contact the source electrode SE of the TFT 131 through the third contact hole provided in the planarization layer 135. According to an embodiment, the first electrode 136 can be formed of a transparent conductive material such as indium tin oxide (ITO), indium zinc oxide (IZO), zinc oxide (ZnO), or indium oxide ($In_2O_3$) having a high work function value and can act as an anode.

The organic light emitting layer 137 can be provided on the first electrode 136. According to an embodiment, the organic light emitting layer 137 can be provided as an organic layer which is provided in common in all of a plurality of pixels without being individually provided in each of the plurality of pixel areas. For example, the organic light emitting layer 137 can be provided on the bank 139 as well as the first electrode 136. Here, the organic light emitting layer 137 can include a hole transporting layer, an organic light emitting layer, and an electron transporting layer. Also, the organic light emitting layer 137 can further include at least one function layer for enhancing the emission efficiency and lifetime of a light emitting layer.

The second electrode 138 can be provided on the organic light emitting layer 137. For example, the second electrode 138 can be implemented as an electrode which is provided in common in all of the pixels without being individually provided in each of the plurality of pixel areas. When a voltage is applied to the first electrode 136 and the second electrode 138, a hole and an electron can move to the light emitting layer through the hole transporting layer and the electron transporting layer and can be combined in the light emitting layer to emit light. The second electrode 138 can act as a cathode of the organic light emitting device E and can be formed of an opaque metal material, and for example, can be formed of lithium (Li), calcium (Ca), LiF/Ca, LiF/Al, Al, or Mg, or a compound thereof.

The bank 139 can be provided on the planarization layer 135. In detail, the bank 139 can be provided between adjacent first electrodes E1 and can divide a plurality of first electrodes 136. Therefore, the bank 139 can electrically insulate the adjacent first electrodes E1 to define the opening area of the organic light emitting device E. For example, the bank 139 can be formed of an organic insulating material such as polyimide resin, acryl resin, or benzocyclobutene (BCB), but is not limited thereto.

The encapsulation layer 140 can cover the pixel array layer 130. The encapsulation layer 140 can be provided on a whole upper end of the second electrode 138. The encapsulation layer 140 can prevent external water or the like from penetrating into the inside, thereby preventing the deterioration of the organic light emitting layer 137. According to an embodiment, the encapsulation layer 140 can be formed of metal, such as copper (Cu) or aluminum (Al), or an alloy thereof, but without being limited thereto, the encapsulation layer 140 can be formed of various materials well known to those skilled in the art.

The filling layer 150 can be filled into a space between the transistor substrate 110 and the color filter substrate 180 and can not be spread to the outside of the display apparatus 100 by a dam. The filling layer 150 can be disposed between the transistor substrate 110 and the color filter substrate 180 to prevent the loss of light and to increase an adhesive force between the transistor substrate 110 and the color filter substrate 180.

The plurality of color filters 162 can be disposed to respectively correspond to the plurality of organic light emitting devices E at the emission part EL. In detail, the plurality of color filters 162 can be provided on the second heat sink layer 420, and the transistor substrate 110 and the color filter substrate 180 can be bonded to each other to correspond to the plurality of organic light emitting devices E. According to an embodiment, the plurality of color filters 162 can be disposed between the filling layer 150 and the second heat sink layer 420 and can be surrounded by the black matrix 164 patterned on the second heat sink layer 420. Also, each of the plurality of color filters 162 can face the first heat sink layer 410 with the filling layer 150 therebetween. For example, the plurality of color filters 162 can be arranged to respectively correspond to the plurality of organic light emitting devices E and can be spaced apart from one another. As another example, adjacent color filters 162 can respectively correspond to the plurality of organic light emitting devices E and can contact one another. Each of the plurality of color filters 162 can be disposed to correspond to a corresponding organic light emitting device E and can convert a color of white light emitted from the corresponding organic light emitting device E. For example, the plurality of color filters 162 can include a red color filter, a green color filter, and a blue color filter. Therefore, each of a red subpixel, a green subpixel, and a blue subpixel of a plurality of subpixels SP can include a corresponding color filter of the color filters 162, and a white subpixel can be implemented without a color filter.

The black matrix 164 can be patterned on the second heat sink layer 420. In detail, the black matrix 164 can overlap the bank 139 which defines the opening area of each of the organic light emitting devices E. For example, the black matrix 164 can be patterned on the second heat sink layer 420 not to overlap the opening area of each of the organic light emitting devices E, and then, when the transistor substrate 110 is bonded to the color filter substrate 180, the black matrix 164 can be disposed between the filling layer 150 and the second heat sink layer 420. In this case, the black matrix 164 can be disposed to overlap the emission part EL of the transistor substrate 110. Also, the black matrix can be disposed between two adjacent color filters 162 and can divide the plurality of color filters 162. In this manner, the black matrix 164 can surround the opening area of each of the organic light emitting devices E and can block light incident on the TFT 131. Also, the black matrix 164 prevents lights emitted from the organic light emitting devices E from being leaked to the non-display area NA to prevent a reduction in contrast ratio. Accordingly, the black matrix 164 enhances an aperture ratio and a light transmittance of the pixel array layer 130, thereby reducing power consumption and enhancing luminance. Also, the black matrix 164 prevent the lights emitted from the organic light emitting devices E from being mixed, thereby preventing light leakage and preventing visibility from being reduced.

The second buffer layer 170 can be provided on the color filter substrate 180. The second buffer layer 170 can be disposed between the second heat sink layer 420 and the color filter substrate 180. The second buffer layer 170 can be provided on a whole front surface of the color filter substrate 180, for preventing water from penetrating into the pixel array layer 130 via the color filter substrate 180. The second buffer layer 170 can be formed by stacking a plurality of inorganic layers. For example, the second buffer layer 170 can be formed of a multilayer where one or more inorganic layers of SiOx, SiNx, and SiON are stacked. The second buffer layer 180 can include a plurality of inorganic layers, thereby enhancing the WVTR of the panel.

The color filter substrate 180 can face the transistor substrate 110 with the encapsulation layer 140 therebetween. In detail, the color filter substrate 180 can be provided on a whole upper end of the filling layer 150. For example, after the plurality of color filters 162 and the black matrix 164 are formed on an upper end of the color filter substrate 180, the color filter substrate 180 can be bonded to the transistor substrate 110. Here, the color filter substrate 180 can be disposed on the transistor substrate 110 so as to prevent external water and air from being penetrating into the TFT 131 and the organic light emitting devices E provided on the transistor substrate 110. According to an embodiment, the color filter substrate 180 can be disposed to face the transistor substrate 110, and the transistor substrate 110 and the color filter substrate 180 can be bonded to each other by a sealing member disposed along an edge thereof. For example, the color filter substrate 180 can be a glass substrate, a plastic substrate, or the like.

The plurality of spacer members 300 can be disposed to surround the plurality of organic light emitting devices E in the peripheral part FA of the transistor substrate 110 and can be spaced apart from one another. In detail, the plurality of spacer members 300 can be disposed between the first and second heat sink layers 410 and 420 to reduce impact transfer between the transistor substrate 110 and the color filter substrate 180. That is, the plurality of spacer members 300 can be disposed on the same layer as the filling layer 150. According to an embodiment, the plurality of color filters 162 and the black matrix 164 can be disposed between the first and second heat sink layers 410 and 420 to overlap the emission part EL of the transistor substrate 110, and the plurality of spacer members 300 can be disposed between the first and second heat sink layers 410 and 420 to overlap the peripheral part FA of the transistor substrate 110. Also, the filling layer 150 can be disposed in a space remaining after the plurality of color filters 162, the black matrix 164, and the plurality of spacer members 300 are disposed, between the first and second heat sink layers 410 and 420.

According to an embodiment, the plurality of spacer members 300 can include a material which is good in impact absorption and flexibility, and can complement the durability of the display apparatus 100. In detail, the plurality of spacer members 300 can be disposed between the first and second heat sink layers 410 and 420 to overlap the peripheral part FA of the transistor substrate 110. That is, the plurality of spacer members 300 can be disposed on the same layer as the filling layer 150 to overlap the peripheral part FA of the transistor substrate 110. In this case, when an external impact is applied to the display apparatus 100, the plurality of spacer members 300 can prevent a movement of the filling layer 150 and can maintain an interval between the transistor substrate 110 and the color filter substrate 180, thereby preventing the light emitting device layer EDL from being peeled. Also, even when the display apparatus 100 implemented as a flexible or stretchable display apparatus is bent or folded, the plurality of spacer members 300 can prevent a movement of the filling layer 150 and can maintain the interval between the transistor substrate 110 and the color filter substrate 180, thereby reducing an external impact. Accordingly, the plurality of spacer members 300 can reduce an external impact applied to the display apparatus 100 in order for the external impact not to be transferred to the TFT 131 and the organic light emitting devices E, thereby complementing the durability of the display apparatus 100 to enhance reliability.

According to an embodiment, the plurality of spacer members 300 can include a material which is good in heat transfer characteristic, and can each act as a heat transfer path between the first and second heat sink layers 410 and 420. In detail, the plurality of spacer members 300 can transfer a heat, which passes through the color filter substrate 180 and reaches the second heat sink layer 420, to the first heat sink layer 410. Here, heat incident through the color filter substrate 180 can correspond to a laser which is irradiated in a laser release process performed on the color filter substrate 180, but is not limited thereto. That is, all heats incident from the outside can be dissipated to the outside by the plurality of spacer members 300 and the first and second heat sink layers 410 and 420. Therefore, heat incident through the color filter substrate 180 can be dispersed to a front surface of the second heat sink layer 420 and can be dissipated to the outside, and moreover, can be dispersed to a front surface of the first heat sink layer 410 through the plurality of spacer members 300 and can be dissipated to the outside, whereby the heat is not transferred to the plurality of organic light emitting devices E. Accordingly, since the display apparatus 100 includes the plurality of spacer members 300 and the first and second heat sink layers 410 and 420, heat passing through the color filter substrate 180 is easily dissipated to the outside.

For example, the plurality of spacer members 300 can be formed by polymerizing metal oxide, carbon, or graphite on acrylonitrile-butadiene-styrene (ABS), polypropylene (PP), or polyamide (PA) resin. The plurality of spacer members 300 is good in impact absorption and flexibility, and moreover, is good in heat transfer characteristic. Therefore, the plurality of spacer members 300 can reduce an external impact applied to the display apparatus 100 in order for the external impact not to be transferred to the TFT 131 and the organic light emitting devices E, and moreover, can easily dissipate heat, transferred to the inside of the display apparatus 100, to the outside.

The first heat sink layer 410 can be disposed on the plurality of organic light emitting devices E. In detail, the first heat sink layer 410 can cover a front surface of the encapsulation layer 140 covering the plurality of organic light emitting devices E. For example, the first heat sink layer 410 can face the plurality of color filters 162 with the filling layer 150 therebetween at the emission part EL of the transistor substrate 110 and can support the plurality of spacer members 300 at the peripheral part FA of the transistor substrate 110. Also, the first heat sink layer 410 and the second heat sink layer 420 can be disposed in parallel and can be spaced apart from each other. Here, the first heat sink layer 410 and the second heat sink layer 420 can be spaced apart from each other by a height of the transistor substrate 110. The first heat sink layer 410 can disperse heat, passing through the transistor substrate 110, to a whole portion of the first heat sink layer 410, or can transfer the heat to the second heat sink layer 420 through the plurality of spacer members 300. Also, the first heat sink layer 410 can disperse heat, which passes through the color filter substrate 180 and is transferred from the second heat sink layer 420 through the plurality of spacer members 300, to the whole portion of the first heat sink layer 410. Accordingly, the first heat sink layer 410 prevents heat, transferred to the inside of the display apparatus 100, from being transferred to the plurality of organic light emitting devices E.

The second heat sink layer 420 can be disposed on the plurality of color filters 162. In detail, the second heat sink layer 420 can be disposed on an upper end of each of the plurality of color filters 162 and the black matrix 164 at the emission part EL of the transistor substrate 110 and can be disposed on an upper end of each of the plurality of spacer members 300 and the filling layer 150 at the peripheral part FA of the transistor substrate 110. That is, the second heat sink layer 420 can be disposed between the black matrix 164 and the second buffer layer 170 at the emission part EL of the transistor substrate 110 and can be disposed between the plurality of spacer members 300 and the second buffer layer 170 at the peripheral part FA of the transistor substrate 110. Also, the first heat sink layer 410 and the second heat sink layer 420 can be disposed in parallel and can be spaced apart from each other. Here, the first heat sink layer 410 and the second heat sink layer 420 can be spaced apart from each other by a height of the plurality of spacer members 300. The second heat sink layer 420 can disperse heat, passing through the color filter substrate 180, to a whole portion of the second heat sink layer 420, or can transfer the heat to the first heat sink layer 410 through the plurality of spacer members 300. Also, the second heat sink layer 420 can disperse heat, which passes through the transistor substrate 110 and is transferred from the first heat sink layer 410 through the plurality of spacer members 300, to the whole portion of the second heat sink layer 420. Accordingly, the second heat sink layer 420 prevents heat, transferred to the inside of the display apparatus 100, from being transferred to the plurality of organic light emitting devices E.

According to an embodiment, each of the first and second heat sink layers 410 and 420 can include SiNx. Also, the plurality of spacer members 300 can be formed by polymerizing metal oxide, carbon, or graphite on acrylonitrile-butadiene-styrene (ABS), polypropylene (PP), or polyamide (PA) resin. The following Table 1 shows thermal conductivity of each of general inorganic layers and the plurality of spacer members 300 at a temperature of 300 K.

TABLE 1

|  | Si | Glass | $SiO_2$ | SiNx | Spacer member 300 |
|---|---|---|---|---|---|
| Thermal conductivity (W/mK) | 148 | 0.8 | 1.4 | 16~22 | ~10 |

Therefore, since the plurality of spacer members 300 is formed by polymerizing metal oxide, carbon, or graphite on acrylonitrile-butadiene-styrene (ABS), polypropylene (PP), or polyamide (PA) resin, the plurality of spacer members 300 is good in impact absorption and flexibility, and moreover, is good in heat transfer characteristic. Also, since each of the first and second heat sink layers 410 and 420 includes SiNx, each of the first and second heat sink layers 410 and 420 is good in heat transfer characteristic. As a result, since the display apparatus 100 includes the plurality of spacer members 300 and the first and second heat sink layers 410 and 420, heat transferred to the inside of the display apparatus 100 is easily dissipated to the outside.

FIGS. 3A to 3D are process cross-sectional views schematically illustrating a method of manufacturing the display apparatus 100 of FIG. 2 according to an example of the present disclosure.

Figure 3A:
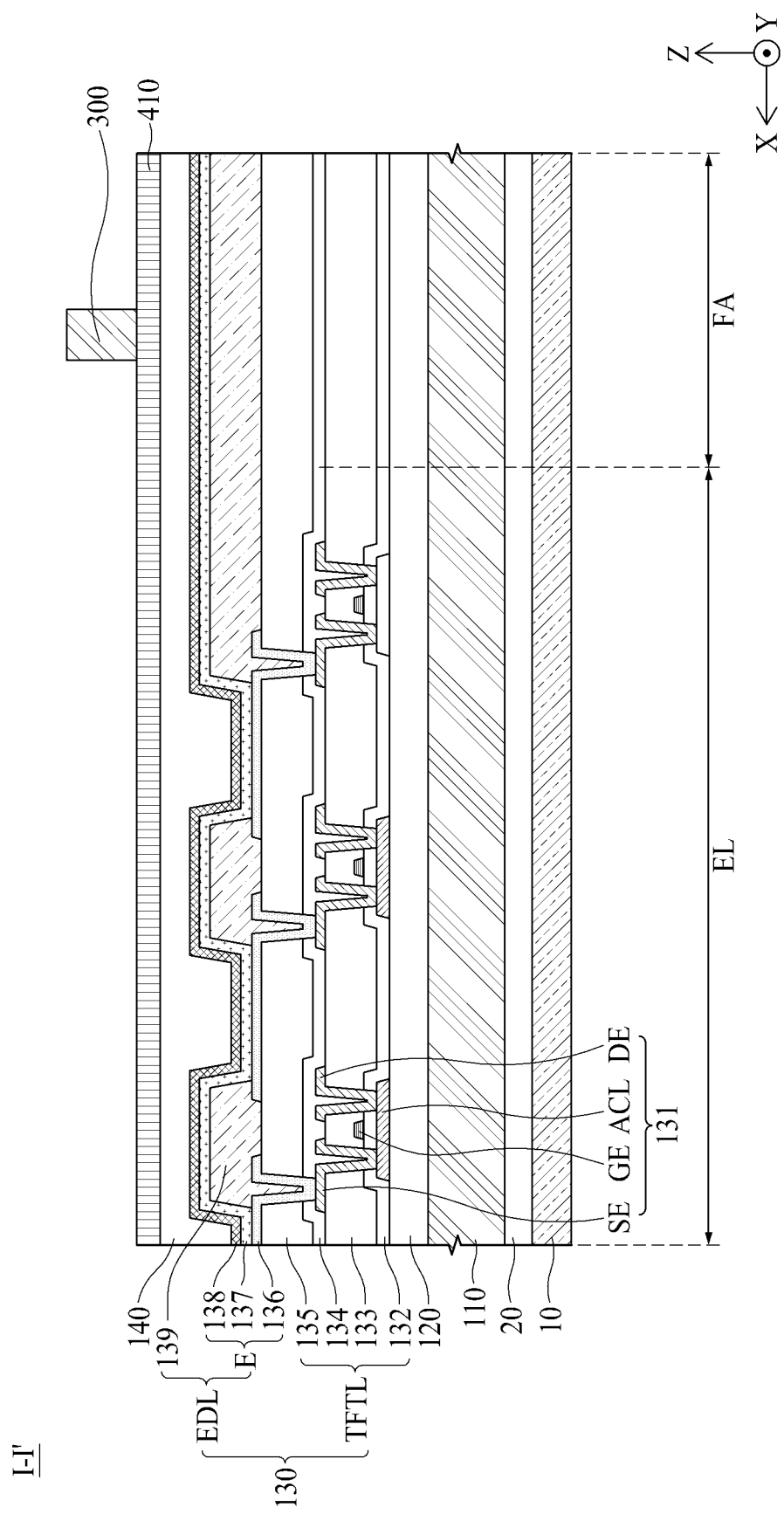
FIGS. 3A to 3D are process cross-sectional views schematically illustrating a method of manufacturing the display apparatus of FIG. 2.

Referring to FIG. 3A, in order to manufacture the display apparatus 100 according to the present disclosure, a first carrier glass substrate 10 can be provided, and a first sacrificial layer 20 can be provided on an upper end of the first carrier glass substrate 10. Also, a transistor substrate 110, a first buffer layer 120, a pixel array layer 130, an encapsulation layer 140, and a first heat sink layer 410 can be sequentially stacked on the first carrier glass substrate 10. Also, a plurality of spacer members 300 can be formed on the first heat sink layer 410 to overlap a peripheral part FA of the transistor substrate 110. Here, a process of forming the plurality of spacer members 300 is not limited to a process where the plurality of spacer members 300 are first formed on the first heat sink layer 410, and then, the transistor substrate 110 is bonded to a color filter substrate 180. In other embodiments, the plurality of spacer members 300 can be first formed on the second heat sink layer 420, or can be inserted in a process of bonding the transistor substrate 110 to the color filter substrate 180. Therefore, the first carrier glass substrate 10 can support the elements while the transistor substrate 110, the first buffer layer 120, the pixel array layer 130, the encapsulation layer 140, and the first heat sink layer 410 are being stacked. Accordingly, the first carrier glass substrate 10 can temporarily act as a supporting substrate.

Figure 3B:
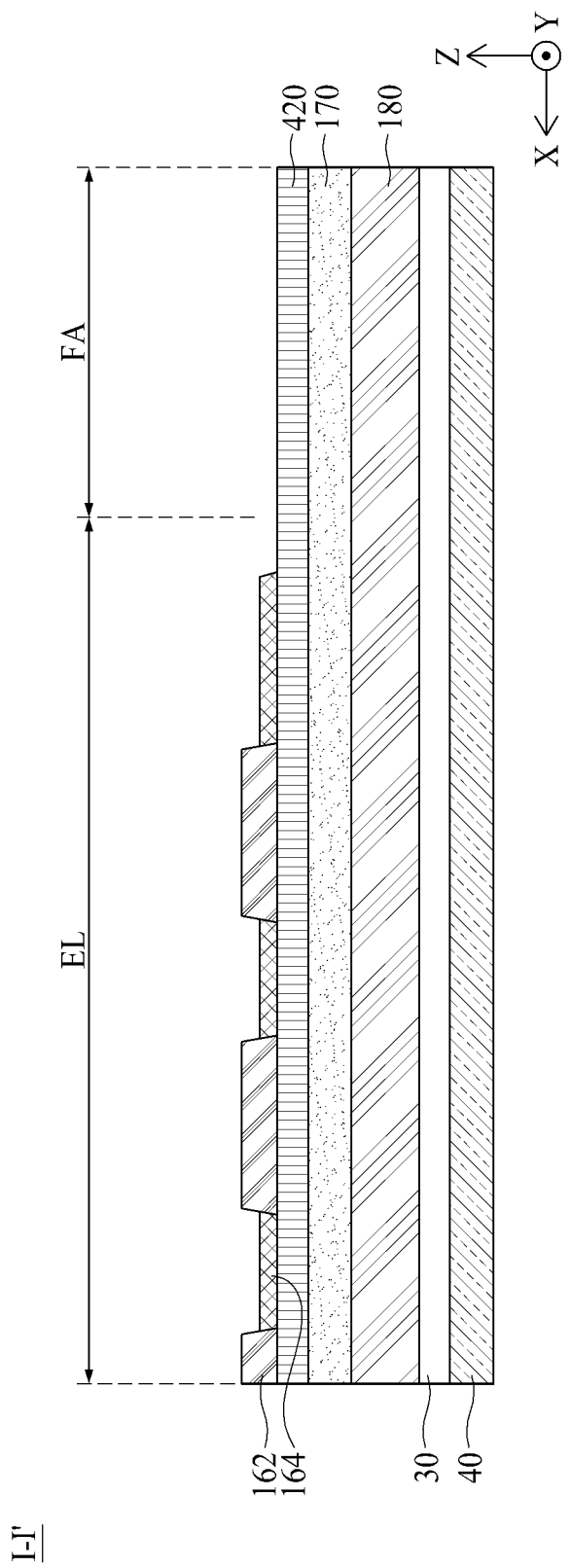

Referring to FIG. 3B, a second carrier glass substrate 30 can be provided, and a second sacrificial layer 40 can be provided on an upper end of the second carrier glass substrate 30. Also, the color filter substrate 180, a second buffer layer 170, and a second heat sink layer 420 can be sequentially stacked on the second carrier glass substrate 30.

Also, a plurality of color filters 162 and a black matrix 164 can be formed on the second heat sink layer 420 to overlap an emission part EL of the transistor substrate 110. Therefore, the second carrier glass substrate 30 can support the elements while the color filter substrate 180, the second buffer layer 170, and the second heat sink layer 420 are being stacked and the plurality of color filters 162 and the black matrix 164 are being formed. Accordingly, the second carrier glass substrate 30 can temporarily act as a supporting substrate.

Figure 3C:
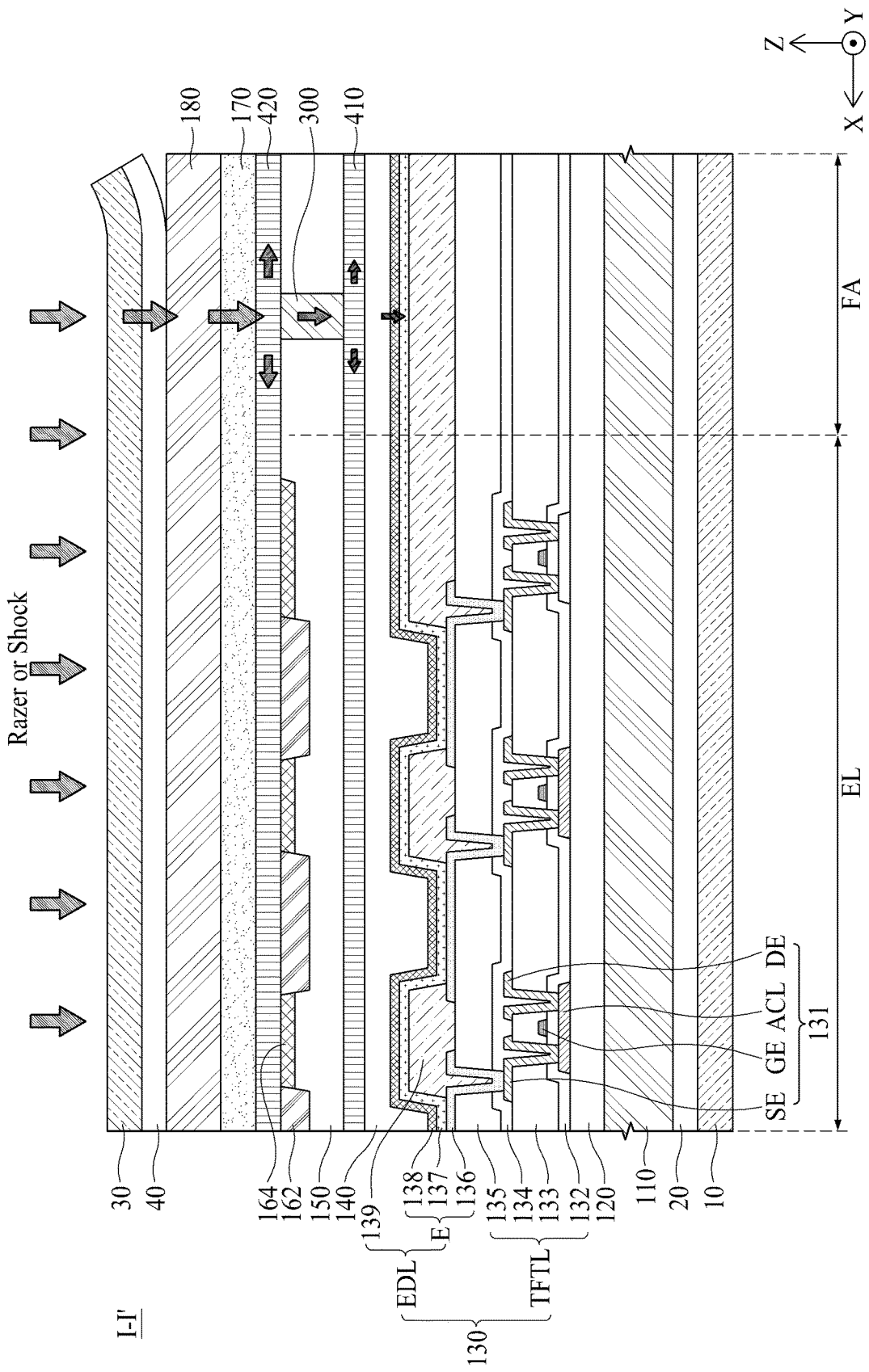

Referring to FIG. 3C, the transistor substrate 110 can be bonded to the color filter substrate 180. Here, a filler can be filled between the transistor substrate 110 and the color filter substrate 180 to form a filling layer 150. That is, the filling layer 150 can be formed between the first and second heat sink layers 410 and 420. For example, the filling layer 150 can be disposed between the plurality of color filters 162, the black matrix 164, and the first heat sink layer 410 at the emission part EL of the transistor substrate 110 and can be disposed between the first and second heat sink layers 410 and 420 to surround the plurality of spacer members 300 at the peripheral part FA of the transistor substrate 110. Also, the transistor substrate 110 and the color filter substrate 180 can be bonded to each other to face a plurality of organic light emitting devices E respectively corresponding to the plurality of color filters 162. Also, the transistor substrate 110 and the color filter substrate 180 can be bonded to each other to face the black matrix 164 and a bank 139.

The second carrier glass substrate 30 can be separated from the color filter substrate 180 by releasing the second sacrificial layer 40 through a laser release process. In detail, when a laser is irradiated onto the second sacrificial layer 40 in front of the second carrier glass substrate 30, heat caused by the laser can pass through the color filter substrate 180 and can be transferred to the second heat sink layer 420. At this time, when the heat caused by the laser is dispersed to a whole portion of the second heat sink layer 420, the second heat sink layer 420 can transfer the heat to a whole portion of the first heat sink layer 410 through the plurality of spacer members 300. Therefore, the plurality of spacer members 300 and the first and second heat sink layers 410 and 420 prevent heat, transferred to the inside of the display apparatus 100, from being transferred to the plurality of organic light emitting devices E, thereby enhancing the reliability of the display apparatus 100.

Figure 3D:
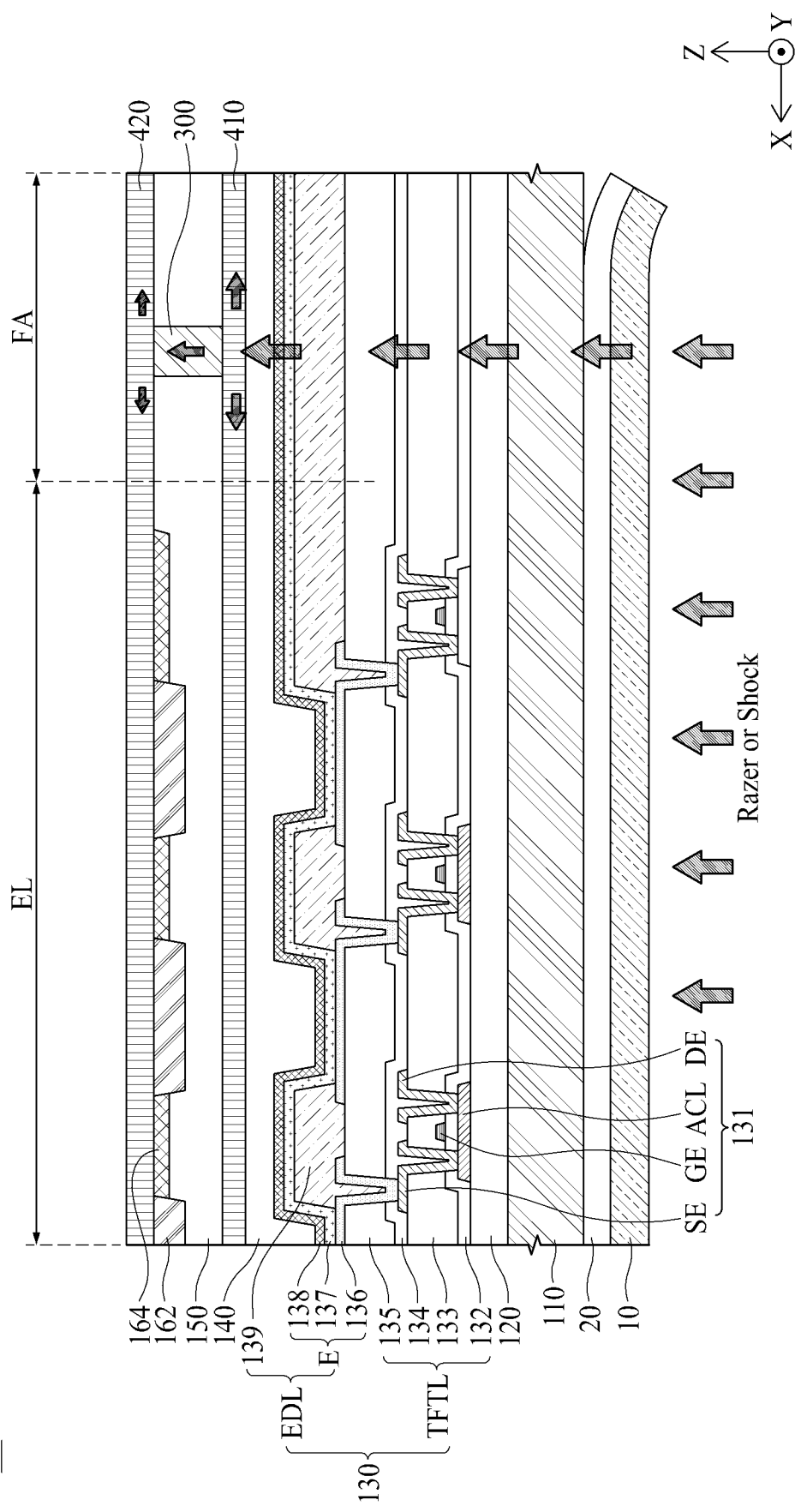

Referring to FIG. 3D, the first carrier glass substrate 10 can be separated from the transistor substrate 110 by releasing the first sacrificial layer 20 through a laser release process. In detail, when a laser is irradiated onto the first sacrificial layer 20 in front of the first carrier glass substrate 10, heat caused by the laser can pass through the transistor substrate 110 and can be transferred to the first heat sink layer 410. At this time, when the heat caused by the laser is dispersed to a whole portion of the first heat sink layer 410, the first heat sink layer 410 can transfer the heat to a whole portion of the second heat sink layer 420 through the plurality of spacer members 300. Therefore, the plurality of spacer members 300 and the first and second heat sink layers 410 and 420 prevent the heat, transferred to the inside of the display apparatus 100, from being transferred to the plurality of organic light emitting devices E, thereby enhancing the reliability of the display apparatus 100.

Figure 4:
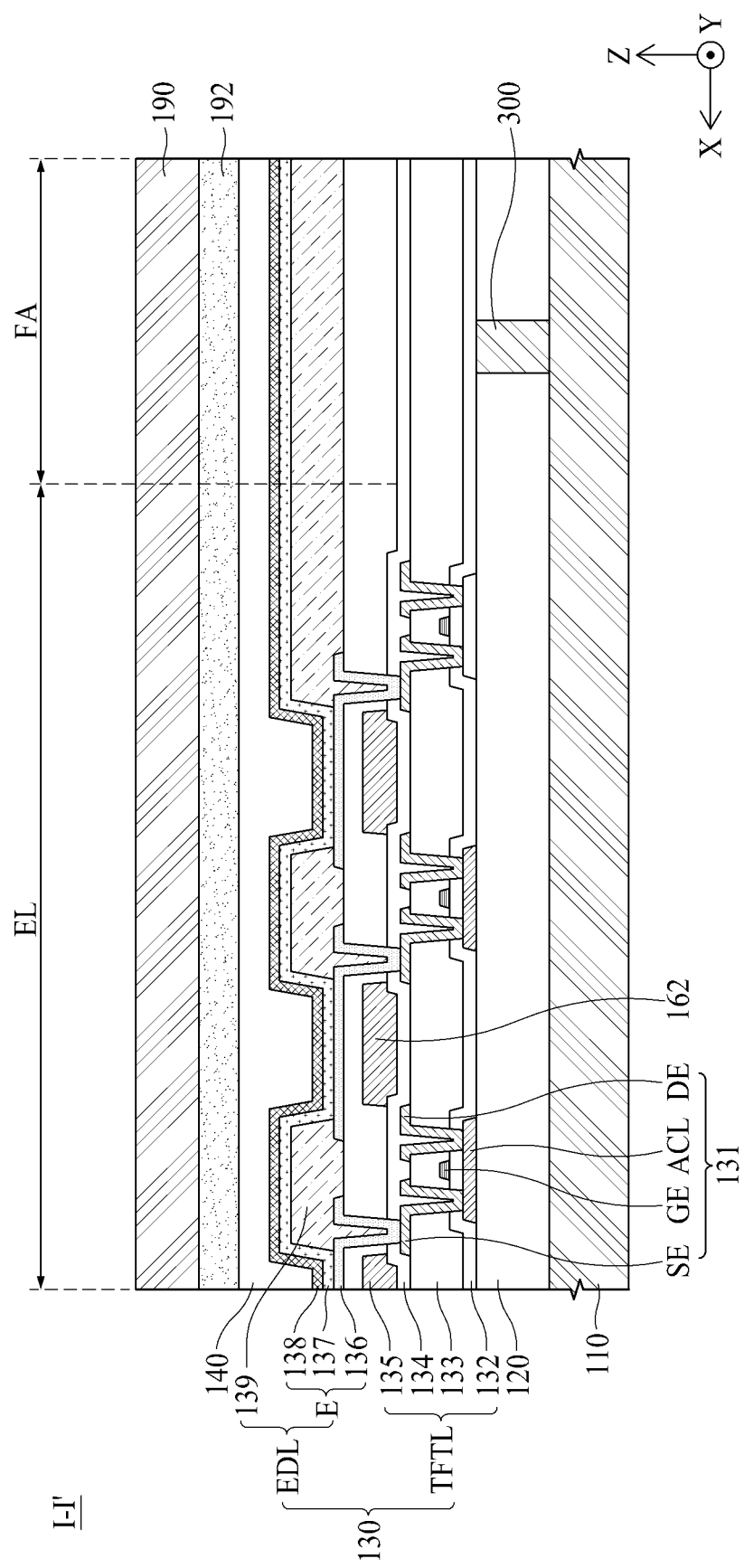
FIG. 4 is a cross-sectional view taken along line I-I' of FIG. 1, in a display apparatus according to a second embodiment of the present disclosure.
Figure 5:
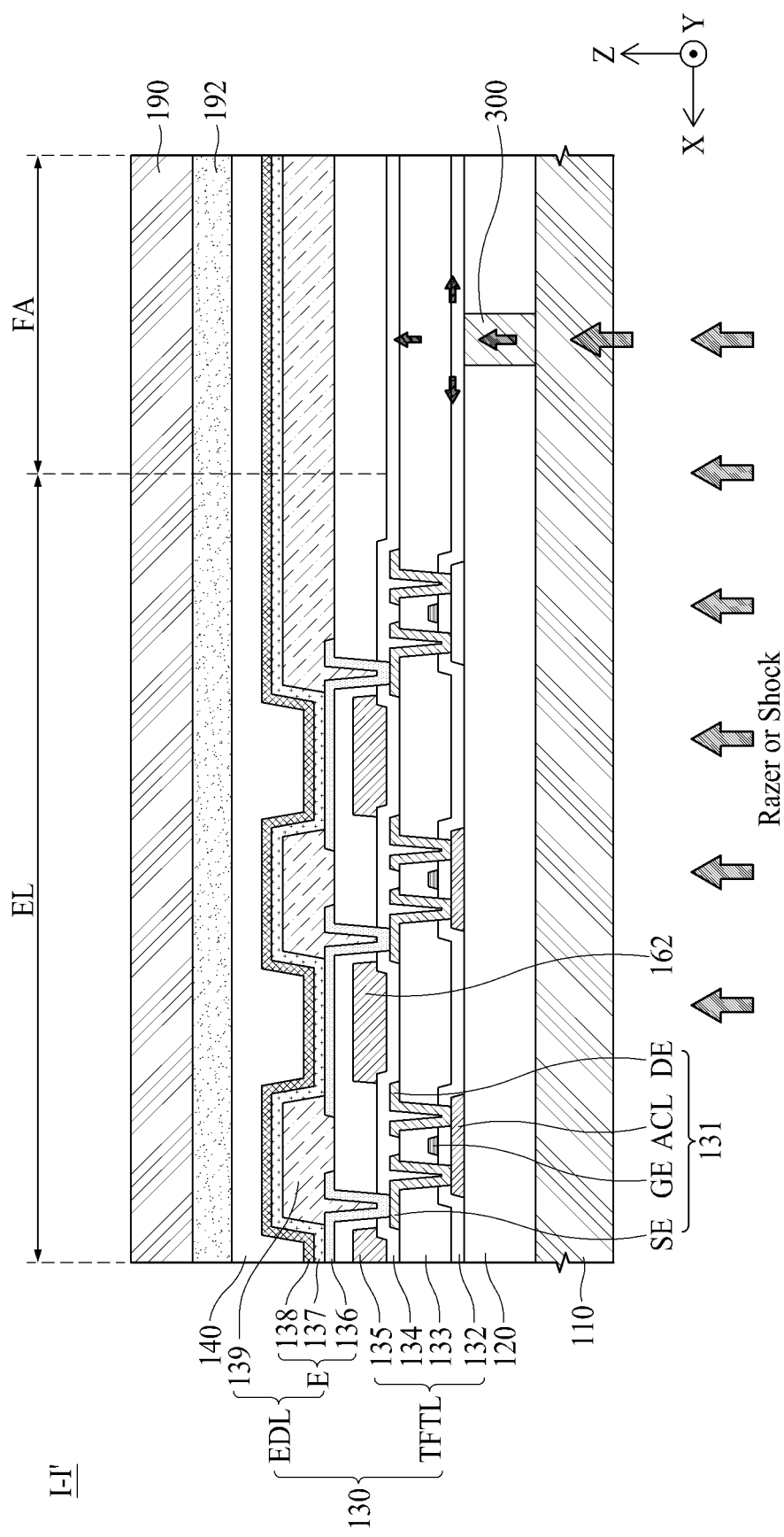
FIG. 5 is a diagram illustrating an impact buffering effect of the display apparatus of FIG. 4.

FIG. 4 is a cross-sectional view taken along line I-I' of FIG. 1, in a display apparatus 100 according to a second embodiment of the present disclosure, and FIG. 5 is a diagram illustrating an impact buffering effect of the display apparatus 100 of FIG. 4. Hereinafter, descriptions of the same elements as the above-described elements will be briefly given or are omitted.

Referring to FIGS. 4 and 5, the display apparatus 100 can be implemented as a bottom emission type and can include a transistor substrate 110, a first buffer layer 120, a pixel array layer 130, an encapsulation layer 140, a plurality of color filters 162, an encapsulation substrate 190, and a plurality of spacer members 300.

The transistor substrate 110, a base substrate, can be a flexible substrate. For example, the transistor substrate 110 can include transparent polyimide.

The first buffer layer 120 can be provided on the transistor substrate 110. The first buffer layer 120 can be provided on a whole front surface of the transistor substrate 110, for preventing water from penetrating into the pixel array layer 130 via the transistor substrate 110.

The pixel array layer 130 can include a TFT layer TFTL and a light emitting device layer EDL. The TFT layer TFTL can include a plurality of TFTs 131, a gate insulation layer 132, an interlayer insulation layer 133, a passivation layer 134, and a planarization layer 135. Also, the light emitting device layer EDL can include a plurality of organic light emitting devices E and a bank 139.

The plurality of TFTs 131 can respectively correspond to the plurality of organic light emitting devices E at an emission part EL of the transistor substrate 110. The plurality of TFTs 131 can each include an active layer ACL, a gate electrode GE, a drain electrode DE, and a source electrode SE. The plurality of organic light emitting devices E can each include a first electrode 136, an organic light emitting layer 137, and a second electrode 138.

The encapsulation layer 140 can cover the pixel array layer 130. In detail, the encapsulation layer 140 can be provided on a whole upper end of the second electrode 138. The encapsulation layer 140 can prevent external water or the like from penetrating into the inside, thereby preventing the deterioration of the organic light emitting layer 137.

The plurality of color filters 162 can be disposed to respectively correspond to the plurality of organic light emitting devices E at the emission part EL. In detail, the plurality of color filters 162 can be provided on the passivation layer 134, and the planarization layer 135 can cover the plurality of color filters 162. Also, each of the plurality of color filters 162 can face a corresponding organic light emitting device E of the plurality of organic light emitting devices E with the planarization layer 135 therebetween. Each of the plurality of color filters 162 can be disposed to correspond to a corresponding organic light emitting device E and can convert a color of white light emitted from the corresponding organic light emitting device E. For example, the plurality of color filters 162 can include a red color filter, a green color filter, and a blue color filter. Therefore, each of a red subpixel, a green subpixel, and a blue subpixel of a plurality of subpixels SP can include a corresponding color filter of the color filters 162, and a white subpixel can be implemented without a color filter.

The encapsulation substrate 190 can be attached on an upper end of the encapsulation layer 140 by an adhesive member 192. In detail, the encapsulation substrate 190 can act as a cover substrate or a cover window, which covers the transistor substrate 110 and the pixel array layer 130. The encapsulation substrate 190 prevents oxygen or water (or other contaminants) from penetrating into the pixel array layer 130.

The plurality of spacer members 300 can be disposed to surround the plurality of organic light emitting devices E at a peripheral part FA of the transistor substrate 110 and can be spaced apart from one another. In detail, the plurality of spacer members 300 can be disposed between the transistor substrate 110 and the TFT layer TFTL to overlap the peripheral part FA of the transistor substrate 110 and can reduce impact transfer between the transistor substrate 110 and the encapsulation substrate 190. That is, the plurality of spacer members 300 can be disposed on the same layer as the first buffer layer 120.

According to an embodiment, the plurality of spacer members 300 can include a material which has a good impact absorption and flexibility, and can complement the durability of the display apparatus 100. In detail, the plurality of spacer members 300 can be disposed between the transistor substrate 110 and the TFT layer TFTL to overlap the peripheral part FA of the transistor substrate 110. In this case, when an external impact is applied to the display apparatus 100, the plurality of spacer members 300 can maintain an interval between the transistor substrate 110 and the TFT layer TFTL, thereby preventing the light emitting device layer EDL from being peeled. Also, even when the display apparatus 100 implemented as a flexible or stretchable display apparatus is bent or folded, the plurality of spacer members 300 can maintain the interval between the transistor substrate 110 and the TFT layer TFTL, thereby reducing an external impact. Accordingly, the plurality of spacer members 300 can reduce an external impact applied to the display apparatus 100 in order for the external impact not to be transferred to the TFTs 131 and the organic light emitting devices E, thereby complementing the durability of the display apparatus 100 to enhance reliability.

As described above, since the display apparatus according to the embodiments of the present disclosure includes the spacer member surrounding the thin film transistor and the organic light emitting device an external impact applied to the display apparatus is reduced so as not to be transferred to the thin film transistor and the organic light emitting device, thereby complementing the durability of the display apparatus to enhance reliability.

Moreover, since the display apparatus according to the embodiments of the present disclosure includes the first and second heat sink layers disposed between the transistor substrate and the color filter substrate and the spacer member disposed between the first and second heat sink layers, heat passing through a substrate is easily dissipated to the outside in the laser release process.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. A display apparatus comprising:
a transistor substrate including a display area having an emission part overlapping a plurality of organic light emitting devices and a peripheral part surrounding the emission part, and a non-display area surrounding the display area;
a plurality of color filters disposed to respectively correspond to the plurality of organic light emitting devices at the emission part;
an encapsulation layer disposed on the plurality of organic light emitting devices;

a first heat sink layer disposed on the encapsulation layer and spaced apart from the plurality of organic light emitting devices;

a second heat sink layer disposed on the plurality of color filters; and a plurality of spacer members spaced apart from each other and disposed to surround the plurality of organic light emitting devices at the peripheral part, and disposed in a vertical direction between the first heat sink layer and the second heat sink layer, wherein a lowermost surface of the second heat sink layer contacts an uppermost surface of each of the plurality of spacer members, and an uppermost surface of the first heat sink layer contacts a lowermost surface of each of the plurality of spacer members, and wherein the plurality of spacer members are not disposed in the non-display area, and the plurality of spacer members are disposed between adjacent organic light emitting devices among the plurality of organic light emitting devices in the display area.

2. The display apparatus of claim 1, further comprising:
a color filter substrate bonded to the transistor substrate; and
a filling layer filled between the transistor substrate and the color filter substrate,
wherein each of the plurality of color filters faces the first heat sink layer with the filling layer therebetween.

3. The display apparatus of claim 2, wherein the plurality of spacer members are disposed on the same layer as the filling layer.

4. The display apparatus of claim 2, further comprising:
a black matrix disposed between two adjacent color filters of the plurality of color filters; and
a first buffer layer disposed between the second heat sink layer and the color filter substrate.

5. The display apparatus of claim 4, wherein the second heat sink layer is disposed between the black matrix and the first buffer layer at the emission part.

6. The display apparatus of claim 4, wherein the second heat sink layer is disposed between the plurality of spacer members and the first buffer layer at the peripheral part.

7. The display apparatus of claim 1, further comprising:
a second buffer layer disposed over the transistor substrate;
a thin film transistor (TFT) layer disposed between the second buffer layer and the plurality of organic light emitting devices, the TFT layer including a plurality of TFTs respectively corresponding to the plurality of organic light emitting devices at the emission part; and
a passivation layer covering the plurality of TFTs.

8. The display apparatus of claim 7, further comprising:
an encapsulation layer covering the plurality of organic light emitting devices; and
an encapsulation substrate attached on an upper end of the encapsulation layer by an adhesive member.

9. The display apparatus of claim 1, wherein the plurality of spacer members are formed by polymerizing metal oxide, carbon, or graphite on acrylonitrile-butadiene-styrene (ABS), polypropylene (PP), or polyamide (PA) resin.

10. The display apparatus of claim 1, wherein each of the first and second heat sink layers comprises silicon nitride (SiNx).

11. The display apparatus of claim 1, wherein the first heat sink layer and the second heat sink layer are disposed in parallel with each other.

12. The display apparatus of claim 1, wherein a side of each of the plurality of spacer members is perpendicular to both of a first perpendicular portion of the first heat sink layer and a second perpendicular portion of the second heat sink layer, and
wherein the uppermost surface of each of the plurality of spacer members contacts the first perpendicular portion of the first heat sink layer, and the lowermost surface of each of the plurality of spacer members contacts the second perpendicular portion of the second heat sink layer.

13. The display apparatus of claim 1, wherein each of plurality of color filters and each of the plurality of spacer members contact the lower most surface of the second heat sink layer.

14. The display apparatus of claim 2, wherein the first heat sink layer is disposed between the filling layer and the encapsulation layer.

15. The display apparatus of claim 14, wherein the first heat sink layer contacts both of the encapsulation layer and the filling layer.

16. The display apparatus of claim 4, wherein each of the plurality of color filters is spaced apart from the black matrix without overlapping with the black matrix in the vertical direction.

17. The display apparatus of claim 1, wherein each of the plurality of spacer members has a circular shape in a plan view of the transistor substrate, and
wherein the plurality of spacer members are arranged in a plurality of columns between the plurality of organic light emitting devices in the plan view.

18. The display apparatus of claim 1, wherein at least one of the plurality of organic light emitting devices has a rectangular shape in a plan view, and
wherein each corner among four corners of the rectangular shape is adjacent to a corresponding spacer member among the plurality of spacer members.

* * * * *